US008712059B2

(12) United States Patent
Del Galdo et al.

(10) Patent No.: US 8,712,059 B2
(45) Date of Patent: Apr. 29, 2014

(54) APPARATUS FOR MERGING SPATIAL AUDIO STREAMS

(75) Inventors: Giovanni Del Galdo, Heroldsberg (DE); Fabian Kuech, Erlangen (DE); Markus Kallinger, Erlangen (DE); Ville Pulkki, Espoo (FI); Mikko-Ville Laitinen, Espoo (FI); Richard Schultz-Amling, Nuremberg (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 518 days.

(21) Appl. No.: 13/026,023

(22) Filed: Feb. 11, 2011

(65) Prior Publication Data

US 2011/0216908 A1 Sep. 8, 2011

Related U.S. Application Data

(63) Continuation of application No. PCT/EP2009/005827, filed on Aug. 11, 2009.

(60) Provisional application No. 61/088,520, filed on Aug. 13, 2008.

(30) Foreign Application Priority Data

Feb. 2, 2009 (EP) .................................... 09001397

(51) Int. Cl.
*H04R 5/00* (2006.01)
*H03G 3/00* (2006.01)

(52) U.S. Cl.
USPC .................................. 381/17; 381/23; 381/61

(58) Field of Classification Search
USPC .............................. 381/61, 63, 93, 23, 17–19
See application file for complete search history.

(56) References Cited

U.S. PATENT DOCUMENTS 6,351,733 B1 2/2002 Saunders et al.
7,231,054 B1 * 6/2007 Jot et al. ........................ 381/310
(Continued)

FOREIGN PATENT DOCUMENTS

CN 1427987 7/2003
CN 1926607 3/2007
(Continued)

OTHER PUBLICATIONS

The Int'l Preliminary Report on Patentability, mailed Oct. 27, 2010, in related PCT patent application No. PCT/EP2009/005827, 13 pages.

(Continued)

*Primary Examiner* — Xu Mei
*Assistant Examiner* — David Ton
(74) *Attorney, Agent, or Firm* — Michael A. Glenn; Perkins Coie LLP

(57) ABSTRACT

An apparatus for merging a first spatial audio stream with a second spatial audio stream to obtain a merged audio stream comprising an estimator for estimating a first wave representation comprising a first wave direction measure and a first wave field measure for the first spatial audio stream, the first spatial audio stream having a first audio representation and a first direction of arrival. The estimator being adapted for estimating a second wave representation comprising a second wave direction measure and a second wave field measure for the second spatial audio stream, the second spatial audio stream having a second audio representation and a second direction of arrival. The apparatus further comprising a processor for processing the first wave representation and the second wave representation to obtain a merged wave representation comprising a merged wave field measure and a merged direction of arrival measure, and for processing the first audio representation and the second audio representation to obtain a merged audio representation, and for providing the merged audio stream comprising the merged audio representation and the merged direction of arrival measure.

15 Claims, 7 Drawing Sheets

(56) References Cited

U.S. PATENT DOCUMENTS

| | | | | |
|---|---|---|---|---|
| 7,706,543 | B2 * | 4/2010 | Daniel | 381/17 |
| 8,170,882 | B2 | 5/2012 | Davis et al. | |
| 2004/0186734 | A1 | 9/2004 | Heo et al. | |
| 2006/0004583 | A1 | 1/2006 | Herre et al. | |
| 2008/0004729 | A1 * | 1/2008 | Hiipakka | 700/94 |
| 2008/0170718 | A1 | 7/2008 | Faller | |

FOREIGN PATENT DOCUMENTS

| | | | |
|---|---|---|---|
| CN | 1954642 | | 4/2007 |
| JP | 2007269127 | | 10/2007 |
| JP | 2008184666 | | 7/2008 |
| JP | 2009543142 | | 12/2009 |
| KR | 1020060122694 | | 11/2006 |
| RU | 2315371 | C2 | 1/2006 |
| WO | WO 2004/077884 | A1 | 9/2004 |
| WO | WO 2007034392 | | 3/2007 |
| WO | WO 2008003362 | | 1/2008 |
| WO | WO 2009050896 | | 4/2009 |

OTHER PUBLICATIONS

The Int'l Search Report and Written Opinion, mailed Dec. 17, 2009, in related PCT patent application No. PCT/EP2009/005827, 16 pages.

Del Galdo, G. et al.: "Efficient Methods for High Quality Merging of Spatial Audio Streams in Directional Audio Coding"; May 8, 2009; AES 126th Convention; 14 pages; Munich, Germany.

Engdegard, J. et al.; Spatial audio object coding (SAOC) the upcoming MPEG standard on parametric object based audio coding; May 17-20, 2008, in $124^{th}$ AES Convention,15 pages; Amsterdam, The Netherlands.

Fahy, F.J.; "Sound Intensity", 1989; Essex: Elsevier Science Publishers Ltd., pp. 38-88.

Gerzon, Michael, "Surround sound psychoacoustics", in *Wireless World,* vol. 80, pp. 483-486, Dec. 1974.

Merimaa, J.: "Applications of a 3-D microphone array", May 2002, in $112^{th}$ *AES Convention,* Paper 5501, 11 pages; Munich, Germany.

Pulkki, V. et al.; "Directional audio coding: Filterbank and STFT-based design", May 20-23, 2006, in 120th AES Convention, 12 pages; Paris, France.

Pulkki, Ville: "Directional Audio Coding in Spatial Sound Reproduction and Stereo Upmixing"; Jun. 30-Jul. 2, 2006; AES 28th Int'l Conference, 8 pages, Pitea, Sweden.

Raymond, David: "Superposition of Plane Waves"; Feb. 21, 2007, XP002530753; retrieved on Jun. 4, 2009, from url: http://phsics.nmt.edu/{raymond/classes/ph13xbook/node25.html; 4 pages.

Villemoes, L. et al.; "MPEG surround: The forthcoming ISO standard for spatial audio coding", Jun. 30-Jul. 2, 2006; in AES 28th International Conference, 18 pages; Pitea, Sweden.

Chanda, P et al., "A Binaural Synthesis with Multiple Sound Sources Based on Spatial Features of Head-Related Transfer Functions", 2006 International Joint Conference on Neural Networks. Sheraton Vancouver Wall Centre Hotel. Vancouver, BC, Canada. Jul. 16-21, 2006., Jul. 2006, 1726-1730.

Kimura, T et al., "Spatial Coding Based on the Extraction of Moving Sound Sources in Wavefield Synthesis", ICASSP 2005, 2005, 293-296.

Pulkki, V. , "Applications of Directional Audio Coding in Audio", 19th International Congress of Acoustics, International Commission for Acoustics, retrieved online from http://decoy.iki.fi/dsound/ambisonic/motherlode/source/rba-15/2002.pdf, Sep. 2007, 6 pages.

* cited by examiner

APPARATUS FOR MERGING SPATIAL AUDIO STREAMS

CROSS-REFERENCE TO RELATED APPLICATIONS

This application is a continuation of International Application No. PCT/EP2009/005827, filed Aug. 11, 2009, which is incorporated herein by reference in its entirety, and additionally claims priority from U.S. Patent Application No. 61/088,520, filed Aug. 13, 2008 and European Patent Application No. 09 001 397.0, filed Feb. 2, 2009, which are all incorporated herein by reference in their entirety.

BACKGROUND OF THE INVENTION

The present invention is in the field of audio processing, especially spatial audio processing, and the merging of multiple spatial audio streams.

DirAC (DirAC=Directional Audio Coding), cf. V. Pulkki and C. Faller, Directional audio coding in spatial sound reproduction and stereo upmixing, In *AES* 28$^{th}$ *International Conference*, Pitea, Sweden, June 2006, and V. Pulkki, A method for reproducing natural or modified spatial impression in Multichannel listening, Patent WO 2004/077884 A1, September 2004, is an efficient approach to the analysis and reproduction of spatial sound. DirAC uses a parametric representation of sound fields based on the features which are relevant for the perception of spatial sound, namely the direction of arrival (DOA=Direction Of Arrival) and diffuseness of the sound field in frequency subbands. In fact, DirAC assumes that interaural time differences (ITD=Interaural Time Differences) and interaural level differences (ILD=Interaural Level Differences) are perceived correctly when the DOA of a sound field is correctly reproduced, while interaural coherence (IC=Interaural Coherence) is perceived correctly, if the diffuseness is reproduced accurately.

These parameters, namely DOA and diffuseness, represent side information which accompanies a mono signal in what is referred to as mono DirAC stream. The DirAC parameters are obtained from a time-frequency representation of the microphone signals. Therefore, the parameters are dependent on time and on frequency. On the reproduction side, this information allows for an accurate spatial rendering. To recreate the spatial sound at a desired listening position a multi-loudspeaker setup is needed. However, its geometry is arbitrary. In fact, the signals for the loudspeakers are determined as a function of the DirAC parameters.

There are substantial differences between DirAC and parametric multichannel audio coding such as MPEG Surround although they share very similar processing structures, cf. Lars Villemoes, Juergen Herre, Jeroen Breebaart, Gerard Hotho, Sascha Disch, Heiko Purnhagen, and Kristofer Kjrlingm, MPEG surround: The forthcoming ISO standard for spatial audio coding, in AES 28th International Conference, Pitea, Sweden, June 2006. While MPEG Surround is based on a time-frequency analysis of the different loudspeaker channels, DirAC takes as input the channels of coincident microphones, which effectively describe the sound field in one point. Thus, DirAC also represents an efficient recording technique for spatial audio.

Another conventional system which deals with spatial audio is SAOC (SAOC=Spatial Audio Object Coding), cf. Jonas Engdegard, Barbara Resch, Cornelia Falch, Oliver Hellmuth, Johannes Hilpert, Andreas Hoelzer, Leonid Terentiev, Jeroen Breebaart, Jeroen Koppens, Erik Schuijer, and Werner Oomen, Spatial audio object coding (SAOC) the upcoming MPEG standard on parametric object based audio coding, in 124$^{th}$ AES Convention, May 17-20, 2008, Amsterdam, The Netherlands, 2008, currently under standardization in ISO/MPEG.

It builds upon the rendering engine of MPEG Surround and treats different sound sources as objects. This audio coding offers very high efficiency in terms of bitrate and gives unprecedented freedom of interaction at the reproduction side. This approach promises new compelling features and functionality in legacy systems, as well as several other novel applications.

SUMMARY

According to an embodiment, an apparatus for merging a first spatial audio stream with a second spatial audio stream to acquire a merged audio stream may have an estimator for estimating a first wave representation comprising a first wave direction measure being a directional quantity of a first wave and a first wave field measure being related to a magnitude of the first wave for the first spatial audio stream, the first spatial audio stream comprising a first audio representation comprising a measure for a pressure of a magnitude of a first audio signal and a first direction of arrival and for estimating a second wave representation comprising a second wave direction measure being a directional quantity of a second wave and a second wave field measure being related to a magnitude of the second wave for the second spatial audio stream, the second spatial audio stream comprising a second audio representation comprising a measure for a pressure or a magnitude of a second audio signal and a second direction of arrival; and a processor for processing the first wave representation and the second wave representation to acquire a merged wave representation comprising a merged wave field measure, a merged direction of arrival measure and a merged diffuseness parameter, wherein the merged diffuseness parameter is based on the merged wave field measure, the first audio representation and the second audio representation, and wherein the merged wave field measure is based on the first wave field measure, the second wave field measure, the first wave direction measure, and the second wave direction measure, and wherein the processor is configured for processing the first audio representation and the second audio representation to acquire a merged audio representation, and for providing the merged audio stream comprising the merged audio representation, the merged direction of arrival measure and the merged diffuseness parameter.

According to another embodiment, a method for merging a first spatial audio stream with a second spatial audio stream to acquire a merged audio stream may have the steps of estimating a first wave representation comprising a first wave direction measure being a directional quantity of a first wave and a first wave field measure being related to a magnitude of the first wave for the first spatial audio stream, the first spatial audio stream comprising a first audio representation comprising a measure for a pressure or a magnitude of a first audio signal and a first direction of arrival; estimating a second wave representation comprising a second wave direction measure being a directional quantity of a second wave and a second wave field measure being related to a magnitude of the second wave for the second spatial audio stream, the second spatial audio stream comprising a second audio representation comprising a measure for a pressure or a magnitude of a second audio signal and a second direction of arrival; processing the first wave representation and the second wave representation to acquire a merged wave representation comprising a merged wave field measure, a merged direction of arrival measure and a merged diffuseness parameter, wherein the merged diffuseness parameter is based on the merged wave field measure, the first audio representation and the second audio representation, and wherein the merged wave field measure is based on the first wave filed measure, the second wave field measure, the first wave direction measure, and the second wave direction measure; processing the first audio representation and the second audio representation to acquire a merged audio representation; and providing the merged audio stream comprising the merged audio representation, a merged direction of arrival measure and the merged diffuseness parameter.

According to another embodiment, a computer program may have a program code for performing the above mentioned method, when the program code runs on a computer or a processor.

Note that the merging would be trivial in the case of a multi-channel DirAC stream, i.e. if the 4 B-format audio channels were available. In fact, the signals from different sources can be directly summed to obtain the B-format signals of the merged stream. However, if these channels are not available direct merging is problematic.

The present invention is based on the finding that spatial audio signals can be represented by the sum of a wave representation, e.g. a plane wave representation, and a diffuse field representation. To the former it may be assigned a direction. When merging several audio streams, embodiments may allow to obtain the side information of the merged stream, e.g. in terms of a diffuseness and a direction. Embodiments may obtain this information from the wave representations as well as the input audio streams. When merging several audio streams, which all can be modeled by a wave part or representation and a diffuse part or representation, wave parts or components and diffuse parts or components can be merged separately. Merging the wave part yields a merged wave part, for which a merged direction can be obtained based on the directions of the wave part representations. Moreover, the diffuse parts can also be merged separately, from the merged diffuse part, an overall diffuseness parameter can be derived.

Embodiments may provide a method to merge two or more spatial audio signals coded as mono DirAC streams. The resulting merged signal can be represented as a mono DirAC stream as well. In embodiments mono DirAC encoding can be a compact way of describing spatial audio, as only a single audio channel needs to be transmitted together with side information.

In embodiments a possible scenario can be a teleconferencing application with more than two parties. For instance, let user A communicate with users B and C, who generate two separate mono DirAC streams. At the location of A, the embodiment may allow the streams of user B and C to be merged into a single mono DirAC stream, which can be reproduced with the conventional DirAC synthesis technique. In an embodiment utilizing a network topology which sees the presence of a multipoint control unit (MCU=multipoint control unit), the merging operation would be performed by the MCU itself, so that user A would receive a single mono DirAC stream already containing speech from both B and C. Clearly, the DirAC streams to be merged can also be generated synthetically, meaning that proper side information can be added to a mono audio signal. In the example just mentioned, user A might receive two audio streams from B and C without any side information. It is then possible to assign to each stream a certain direction and diffuseness, thus adding the side information needed to construct the DirAC streams, which can then be merged by an embodiment.

Another possible scenario in embodiments can be found in multiplayer online gaming and virtual reality applications. In these cases several streams are generated from either players or virtual objects. Each stream is characterized by a certain direction of arrival relative to the listener and can therefore be expressed by a DirAC stream. The embodiment may be used to merge the different streams into a single DirAC stream, which is then reproduced at the listener position.

BRIEF DESCRIPTION OF THE DRAWINGS

Embodiments of the present invention will be detailed subsequently referring to the appended drawings, in which.

DETAILED DESCRIPTION OF THE INVENTION

Figure 1A:
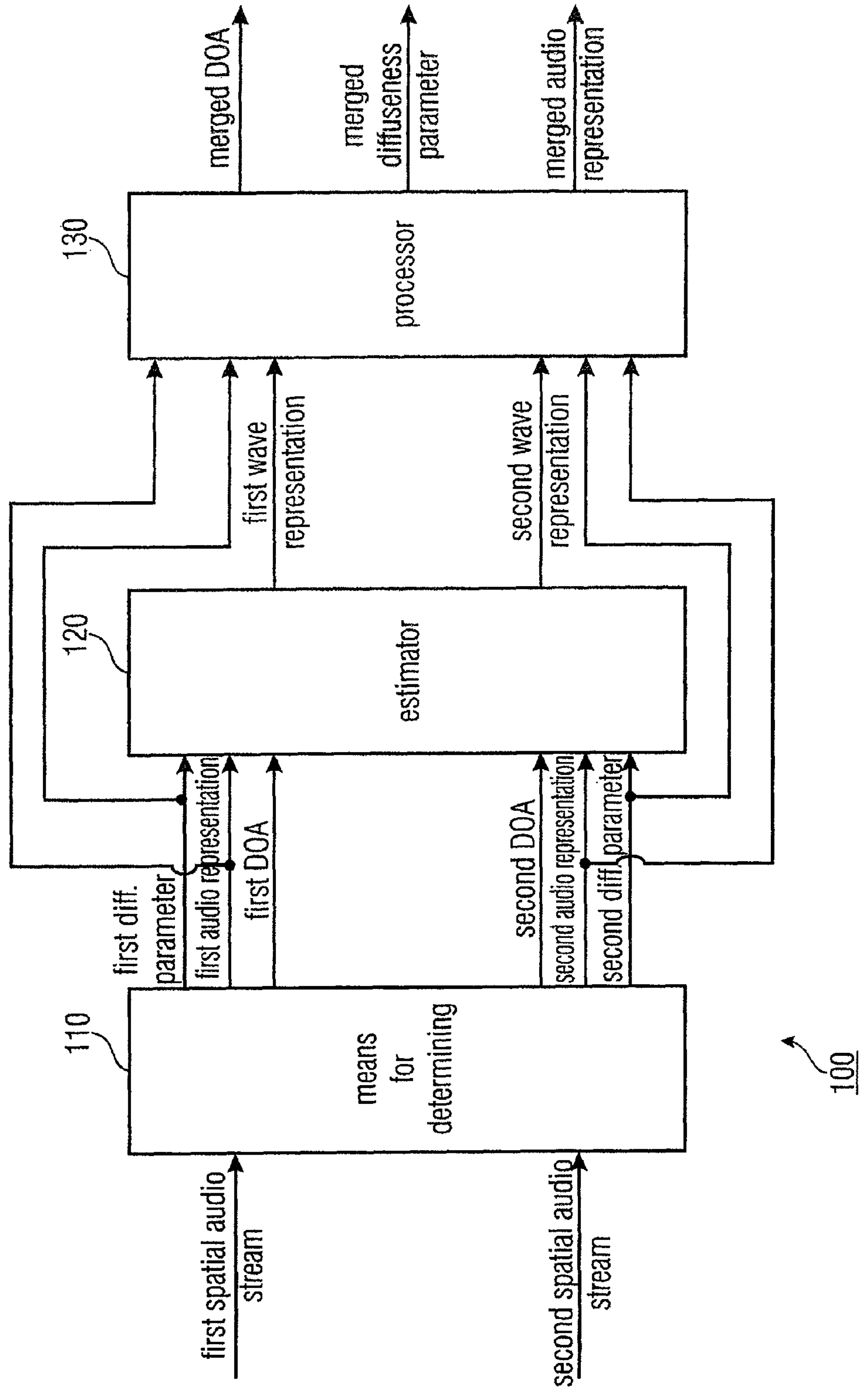
FIG. 1*a* is an embodiment of an apparatus for merging.

FIG. 1*a* illustrates an embodiment of an apparatus 100 for merging a first spatial audio stream with a second spatial audio stream to obtain a merged audio stream. The embodiment illustrated in FIG. 1*a* illustrates the merge of two audio streams, however shall not be limited to two audio streams, in a similar way, multiple spatial audio streams may be merged. The first spatial audio stream and the second spatial audio stream may, for example, correspond to mono DirAC streams and the merged audio stream may also correspond to a single mono DirAC audio stream. As will be detailed subsequently, a mono DirAC stream may comprise a pressure signal e.g. captured by an omni-directional microphone and side information. The latter may comprise time-frequency dependent measures of diffuseness and direction of arrival of sound.

FIG. 1*a* shows an embodiment of an apparatus 100 for merging a first spatial audio stream with a second spatial audio stream to obtain a merged audio stream, comprising an estimator 120 for estimating a first wave representation comprising a first wave direction measure and a first wave field measure for the first spatial audio stream, the first spatial audio stream having a first audio representation and a first direction of arrival, and for estimating a second wave representation comprising a second wave direction measure and a second wave field measure for the second spatial audio stream, the second spatial audio stream having a second audio representation and a second direction of arrival. In embodiments the first and/or second wave representation may correspond to a plane wave representation.

In the embodiment shown in FIG. 1*a* the apparatus 100 further comprises a processor 130 for processing the first wave representation and the second wave representation to obtain a merged wave representation comprising a merged field measure and a merged direction of arrival measure and for processing the first audio representation and the second audio representation to obtain a merged audio representation, the processor 130 is further adapted for providing the merged audio stream comprising the merged audio representation and the merged direction of arrival measure.

The estimator 120 can be adapted for estimating the first wave field measure in terms of a first wave field amplitude, for estimating the second wave field measure in terms of a second wave field amplitude and for estimating a phase difference between the first wave field measure and the second wave field measure. In embodiments the estimator can be adapted for estimating a first wave field phase and a second wave field phase. In embodiments, the estimator 120 may estimate only a phase shift or difference between the first and second wave representations, the first and second wave field measures, respectively. The processor 130 may then accordingly be adapted for processing the first wave representation and the second wave representation to obtain a merged wave representation comprising a merged wave field measure, which may comprise a merged wave field amplitude, a merged wave field phase and a merged direction of arrival measure, and for processing the first audio representation and the second audio representation to obtain a merged audio representation.

In embodiments the processor 130 can be further adapted for processing the first wave representation and the second wave representation to obtain the merged wave representation comprising the merged wave field measure, the merged direction of arrival measure and a merged diffuseness parameter, and for providing the merged audio stream comprising the merged audio representation, the merged direction of arrival measure and the merged diffuseness parameter.

In other words, in embodiments a diffuseness parameter can be determined based on the wave representations for the merged audio stream. The diffuseness parameter may establish a measure of a spatial diffuseness of an audio stream, i.e. a measure for a spatial distribution as e.g. an angular distribution around a certain direction. In an embodiment a possible scenario could be the merging of two mono synthetic signals with just directional information.

The processor 130 can be adapted for processing the first wave representation and the second wave representation to obtain the merged wave representation, wherein the merged diffuseness parameter is based on the first wave direction measure and on the second wave direction measure. In embodiments the first and second wave representations may have different directions of arrival and the merged direction of arrival may lie in between them. In this embodiment, although the first and second spatial audio streams may not provide any diffuseness parameters, the merged diffuseness parameter can be determined from the first and second wave representations, i.e. based on the first wave direction measure and on the second wave direction measure. For example, if two plane waves impinge from different directions, i.e. the first wave direction measure differs from the second wave direction measure, the merged audio representation may comprise a combined merged direction of arrival with a none-vanishing merged diffuseness parameter, in order to account for the first wave direction measure and the second wave direction measure. In other words, while two focussed spatial audio streams may not have or provide any diffuseness, the merged audio stream may have a none-vanishing diffuseness, as it is based on the angular distribution established by the first and second audio streams.

Embodiments may estimate a diffuseness parameter $\Psi$, for example, for a merged DirAC stream. Generally, embodiments may then set or assume the diffuseness parameters of the individual streams to a fixed value, for instance 0 or 0.1, or to a varying value derived from an analysis of the audio representations and/or direction representations.

In other embodiments, the apparatus 100 for merging the first spatial audio stream with the second spatial audio stream to obtain a merged audio stream, may comprise the estimator 120 for estimating the first wave representation comprising a first wave direction measure and a first wave field measure for the first spatial audio stream, the first spatial audio stream having the first audio representation, the first direction of arrival and a first diffuseness parameter. In other words, the first audio representation may correspond to an audio signal with a certain spatial width or being diffuse to a certain extend. In one embodiment, this may correspond to scenario in a computer game. A first player may be in a scenario, where the first audio representation represents an audio source as for example a train passing by, creating a diffuse sound field to a certain extend. In such an embodiment, sounds evoked by the train itself may be diffuse, a sound produced by the train's horn, i.e. the corresponding frequency components, may not be diffuse.

The estimator 120 may further be adapted for estimating the second wave representation comprising the second wave direction measure and the second wave field measure for the second spatial audio stream, the second spatial audio stream having the second audio representation, the second direction of arrival and a second diffuseness parameter. In other words, the second audio representation may correspond to an audio signal with a certain spatial width or being diffuse to a certain extend. Again this may correspond to the scenario in the computer game, where a second sound source may be represented by the second audio stream, for example, background noise of another train passing by on another track. For the first player in the computer game, both sound source may be diffuse as he is located at the train station.

In embodiments the processor 130 can be adapted for processing the first wave representation and the second wave representation to obtain the merged wave representation comprising the merged wave field measure and the merged direction of arrival measure, and for processing the first audio representation and the second audio representation to obtain the merged audio representation, and for providing the merged audio stream comprising the merged audio representation and the merged direction of arrival measure. In other words the processor 130 may not determine a merged diffuseness parameter. This may correspond to the sound field experienced by a second player in the above-described computer game. The second player may be located farther away from the train station, so the two sound sources may not be experienced as diffuse by the second player, but represent rather focussed sound sources, due to the larger distance.

In embodiments the apparatus 100 may further comprise a means 110 for determining for the first spatial audio stream the first audio representation and the first direction of arrival, and for determining for the second spatial audio stream the second audio representation and the second direction of arrival. In embodiments the means 110 for determining may be provided with a direct audio stream, i.e. the determining may just refer to reading the audio representation in terms of e.g. a pressure signal and a DOA and optionally also diffuseness parameters in terms of the side information.

The estimator 120 can be adapted for estimating the first wave representation from the first spatial audio stream further having a first diffuseness parameter and/or for estimating the second wave representation from the second spatial audio stream further having a second diffuseness parameter, the processor 130 may be adapted for processing the merged wave field measure, the first and second audio representations and the first and second diffuseness parameters to obtain the merged diffuseness parameter for the merged audio stream, and the processor 130 can be further adapted for providing the audio stream comprising the merged diffuseness parameter. The means 110 for determining can be adapted for determining the first diffuseness parameter for the first spatial audio stream and the second diffuseness parameter for the second spatial audio stream.

The processor 130 can be adapted for processing the spatial audio streams, the audio representations, the DOA and/or the diffuseness parameters blockwise, i.e. in terms of segments of samples or values. In some embodiments a segment may comprise a predetermined number of samples corresponding to a frequency representation of a certain frequency band at a certain time of a spatial audio stream. Such segment may correspond to a mono representation and have associated a DOA and a diffuseness parameter.

In embodiments the means 110 for determining can be adapted for determining the first and second audio representation, the first and second direction of arrival and the first and second diffuseness parameters in a time-frequency dependent way and/or the processor 130 can be adapted for processing the first and second wave representations, diffuseness parameters and/or DOA measures and/or for determining the merged audio representation, the merged direction of arrival measure and/or the merged diffuseness parameter in a time-frequency dependent way.

In embodiments the first audio representation may correspond to a first mono representation and the second audio representation may correspond to a second mono representation and the merged audio representation may correspond to a merged mono representation. In other words, the audio representations may correspond to a single audio channel.

In embodiments, the means 110 for determining can be adapted for determining and/or the processor can be adapted for processing the first and second mono representation, the first and the second DOA and a first and a second diffuseness parameter and the processor 130 may provide the merged mono representation, the merged DOA measure and/or the merged diffuseness parameter in a time-frequency dependent way. In embodiments the first spatial audio stream may already be provided in terms of, for example, a DirAC representation, the means 110 for determining may be adapted for determining the first and second mono representation, the first and second DOA and the first and second diffuseness parameters simply by extraction from the first and the second audio streams, e.g. from the DirAC side information.

In the following, an embodiment will be illuminated in detail, where the notation and the data model are to be introduced first. In embodiments, the means 110 for determining can be adapted for determining the first and second audio representations and/or the processor 130 can be adapted for providing a merged mono representation in terms of a pressure signal p(t) or a time-frequency transformed pressure signal P(k,n), wherein k denotes a frequency index and n denotes a time index.

In embodiments the first and second wave direction measures as well as the merged direction of arrival measure may correspond to any directional quantity, as e.g. a vector, an angle, a direction etc. and they may be derived from any directional measure representing an audio component as e.g. an intensity vector, a particle velocity vector, etc. The first and second wave field measures as well as the merged wave field measure may correspond to any physical quantity describing an audio component, which can be real or complex valued, correspond to a pressure signal, a particle velocity amplitude or magnitude, loudness etc. Moreover, measures may be considered in the time and/or frequency domain.

Embodiments may be based on the estimation of a plane wave representation for the wave field measures of the wave representations of the input streams, which can be carried out by the estimator 120 in FIG. 1*a*. In other words the wave field measure may be modelled using a plane wave representation. In general there exist several equivalent exhaustive (i.e., complete) descriptions of a plane wave or waves in general. In the following a mathematical description will be introduced for computing diffuseness parameters and directions of arrivals or direction measures for different components. Although only a few descriptions relate directly to physical quantities, as for instance pressure, particle velocity etc., potentially there exist an infinite number of different ways to describe wave representations, of which one shall be presented as an example subsequently, however, not meant to be limiting in any way to embodiments of the present invention.

In order to further detail different potential descriptions two real numbers a and b are considered. The information contained in a and b may be transferred by sending c and d, when $$\begin{bmatrix} c \\ d \end{bmatrix} = \Omega \begin{bmatrix} a \\ b \end{bmatrix},$$

wherein Ω is a known 2×2 matrix. The example considers only linear combinations, generally any combination, i.e. also a non-linear combination, is conceivable.

In the following scalars are represented by small letters a,b,c, while column vectors are represented by bold small letters a,b,c. The superscript $(\ )^T$ denotes the transpose, respectively, whereas $\overline{(\bullet)}$ and $(\bullet)^*$ denote complex conjugation. The complex phasor notation is distinguished from the temporal one. For instance, the pressure p(t), which is a real number and from which a possible wave field measure can be derived, can be expressed by means of the phasor P, which is a complex number and from which another possible wave field measure can be derived, by $$p(t) = Re\{Pe^{j\omega t}\},$$

wherein Re{•} denotes the real part and ω=2πf if is the angular frequency. Furthermore, capital letters used for physical quantities represent phasors in the following. For the following introductory example and to avoid confusion, please note that all quantities with subscript "PW" considered in the following refer to plane waves.

For an ideal monochromatic plane wave the particle velocity vector $U_{PW}$ can be noted as $$U_{PW} = \frac{P_{PW}}{\rho_0 c} e_d = \begin{bmatrix} U_x \\ U_y \\ U_z \end{bmatrix},$$

where the unit vector $e_d$ points towards the direction of propagation of the wave, e.g. corresponding to a direction measure. It can be proven that $$I_a = \frac{1}{2\rho_0 c} |P_{PW}|^2 e_d \qquad \text{(a)}$$

$$E = \frac{1}{2\rho_0 c^2} |P_{PW}|^2$$

$$\Psi = 0,$$

wherein $I_a$ denotes the active intensity, $\rho_0$ denotes the air density, c denotes the speed of sound, E denotes the sound field energy and Ψ denotes the diffuseness.

Figure 1B:
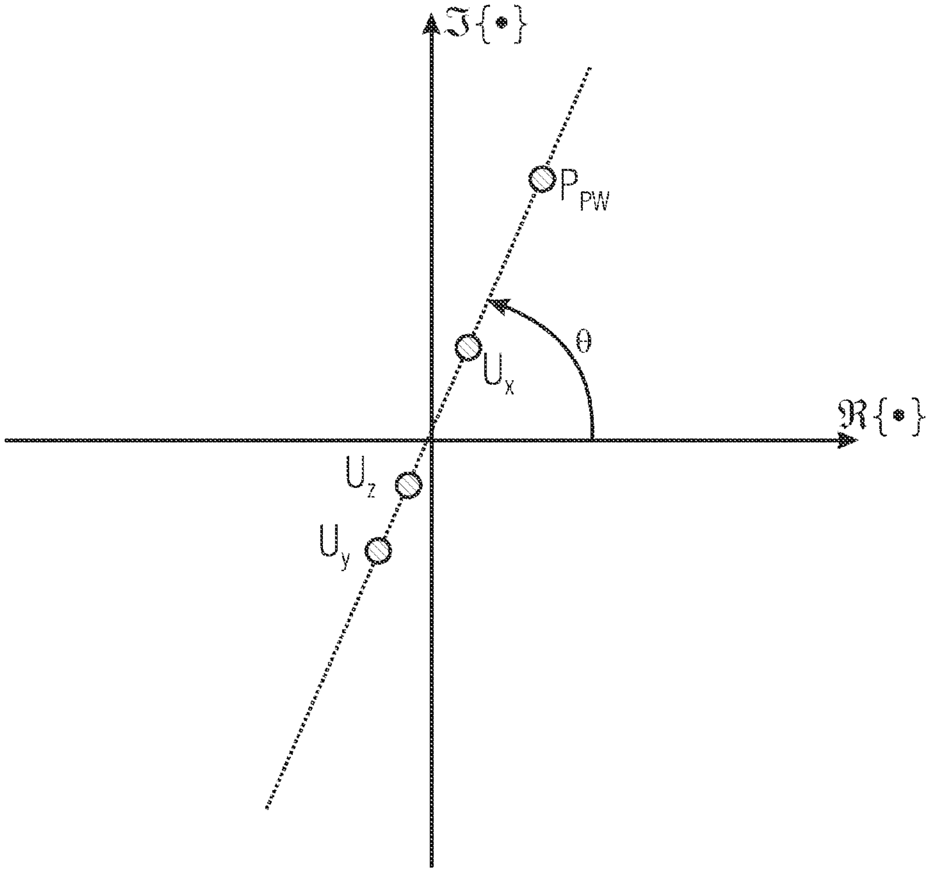
FIG. 1*b* is pressure and components of a particle velocity vector in a Gaussian plane for a plane wave.

It is interesting to note that since all components of $e_d$ are real numbers, the components of $U_{PW}$ are all in-phase with $P_{PW}$. FIG. 1*b* illustrates an exemplary $U_{PW}$ and $P_{PW}$ in the Gaussian plane. As just mentioned, all components of $U_{PW}$ share the same phase as $P_{PW}$, namely θ. Their magnitudes, on the other hand, are bound to $$\frac{|P_{PW}|}{c} = \sqrt{|U_x|^2 + |U_y|^2 + |U_z|^2} = \|U_{PW}\|.$$

Even when multiple sound sources are present, the pressure and particle velocity can still be expressed as a sum of individual components. Without loss of generality, the case of two sound sources can be illuminated. In fact, the extension to larger numbers of sources is straight-forward.

Let $P^{(1)}$ and $P^{(2)}$ be the pressures which would have been recorded for the first and second source, respectively, e.g. representing the first and second wave field measures.

Similarly, let $U^{(1)}$ and $U^{(2)}$ be the complex particle velocity vectors. Given the linearity of the propagation phenomenon, when the sources play together, the observed pressure P and particle velocity U are $$P=P^{(1)}+P^{(2)}$$

$$U=U^{(1)}+U^{(2)}$$

Therefore, the active intensities are $$I_a^{(1)}=\tfrac{1}{2}Re\{P^{(1)}\cdot\overline{U^{(1)}}\}$$

$$I_a^{(2)}=\tfrac{1}{2}Re\{P^{(2)}\cdot\overline{U^{(2)}}\}$$

Thus $$I_a=I_a^{(1)}+I_a^{(2)}+\tfrac{1}{2}Re\{P^{(1)}\cdot\overline{U^{(2)}}+P^{(2)}\cdot\overline{U^{(1)}}\}.$$

Note that apart from special cases, $$I_a\neq I_a^{(1)}+I_a^{(2)}.$$

When the two, e.g. plane, waves are exactly in-phase (although traveling towards different directions), $$P^{(2)}=\gamma\cdot P^{(1)},$$

wherein γ is a real number. It follows that $$I_a^{(1)}=\tfrac{1}{2}Re\{P^{(1)}\cdot\overline{U^{(1)}}\}$$

$$I_a^{(2)}=\tfrac{1}{2}Re\{P^{(2)}\cdot\overline{U^{(2)}}\},$$

$$\|I_a^{(2)}\|=|\gamma|^2\|I_a^{(1)}\|$$

and $$I_a = (1+\gamma)I_a^{(1)} + \left(1+\frac{1}{\gamma}\right)I_a^{(2)}.$$

When the waves are in-phase and traveling towards the same direction they can be clearly interpreted as one wave.

For γ=−1 and any direction, the pressure vanishes and there can be no flow of energy, i.e., $\|I_a\|=0$.

When the waves are perfectly in quadrature, then $$P^{(2)}=\gamma\cdot e^{j\pi/2}P^{(1)}$$

$$U^{(2)}=\gamma\cdot e^{j\pi/2}U^{(1)}$$

$$U_x^{(2)}=\gamma\cdot e^{j\pi/2}U_x^{(1)},$$

$$U_y^{(2)}=\gamma\cdot e^{j\pi/2}U_y^{(1)}$$

$$U_z^{(2)}=\gamma\cdot e^{j\pi/2}U_z^{(1)}$$

wherein γ is a real number. From this it follows that $$I_a^{(1)}=\tfrac{1}{2}Re\{P^{(1)}\cdot\overline{U^{(1)}}\}$$

$$I_a^{(2)}=\tfrac{1}{2}Re\{P^{(2)}\cdot\overline{U^{(2)}}\},$$

$$\|I_a^{(2)}\|=|\gamma|^2\|I_a^{(1)}\|$$

and $$I_a=I_a^{(1)}+I_a^{(2)}.$$

Using the above equations it can easily be proven that for a plane wave each of the exemplary quantities U, P and $e_d$, or P and $I_a$ may represent an equivalent and exhaustive description, as all other physical quantities can be derived from them, i.e., any combination of them may in embodiments be used in place of the wave field measure or wave direction measure. For example, in embodiments the 2-norm of the active intensity vector may be used as wave field measure.

A minimum description may be identified to perform the merging as specified by the embodiments. The pressure and particle velocity vectors for the i-th plane wave can be expressed as $$P^{(i)} = |P^{(i)}|e^{j\angle P^{(i)}}$$

$$U^{(i)} = \frac{|P^{(i)}|}{\rho_0 c}e_d^{(i)}e^{j\angle P^{(i)}}$$

wherein $\angle P^{(i)}$ represents the phase of $P^{(i)}$. Expressing the merged intensity vector, i.e. the merged wave field measure and the merged direction of arrival measure, with respect to these variables it follows $$I_a = \frac{1}{2\rho_0 c}|P^{(1)}|^2 e_d^{(1)} + \frac{1}{2\rho_0 c}|P^{(2)}|^2 e_d^{(2)} + + \frac{1}{2}\mathrm{Re}\left\{|P^{(1)}|e^{j\angle P^{(1)}}\frac{|P^{(2)}|}{\rho_0 c}e_d^{(2)}e^{-j\angle P^{(2)}}\right\} + + \frac{1}{2}\mathrm{Re}\left\{|P^{(2)}|e^{j\angle P^{(2)}}\frac{|P^{(1)}|}{\rho_0 c}e_d^{(1)}e^{-j\angle P^{(1)}}\right\}.$$

Note that the first two summands are $I_a^{(1)}$ and $I_a^{(2)}$. The equation can be further simplified to $$I_a = \frac{1}{2\rho_0 c}|P^{(1)}|^2 e_d^{(1)} + \frac{1}{2\rho_0 c}|P^{(2)}|^2 e_d^{(2)} + + \frac{1}{2\rho_0 c}|P^{(1)}|\cdot|P^{(2)}| e_d^{(2)}\cdot\cos(\angle P^{(1)} - \angle P^{(2)}) + + \frac{1}{2\rho_0 c}|P^{(2)}|\cdot|P^{(1)}|e_d^{(1)}\cdot\cos(\angle P^{(2)} - \angle P^{(1)}).$$

Introducing $$\Delta^{(1,2)}=|\angle P^{(2)}-\angle P^{(1)}|$$

it yields $$I_a = \frac{1}{2\rho_0 c}\{|P^{(1)}|^2 e_d^{(1)} + |P^{(2)}|^2 e_d^{(2)} + |P^{(1)}|\cdot|P^{(2)}|\cos(\Delta^{(1,2)})\cdot(e_d^{(1)} + e_d^{(2)})\}. \quad \text{(b)}$$

This equation shows that the information needed to compute $I_a$ can be reduced to $|P^{(i)}|$, $e_d^{(i)}$, $|\angle P^{(2)}-\angle P^{(1)}|$. In other words, the representation for each e.g. plane, wave can be reduced to the amplitude of the wave and the direction of propagation. Furthermore, the relative phase difference between the waves may be considered as well. When more than two waves are to be merged, the phase differences between all pairs of waves may be considered. Clearly, there exist several other descriptions which contain the very same information. For instance, knowing the intensity vectors and the phase difference would be equivalent.

Generally, an energetic description of the plane waves may not be enough to carry out the merging correctly. The merging could be approximated by assuming the waves in quadrature. An exhaustive descriptor of the waves (i.e., all physical quantities of the wave are known) can be sufficient for the merging, however may not be necessary in all embodiments. In embodiments carrying out correct merging the amplitude of each wave, the direction of propagation of each wave and the relative phase difference between each pair of waves to be merged may be taken into account.

The means 110 for determining can be adapted for providing and/or the processor 130 can be adapted for processing the first and second directions of arrival and/or for providing the merged direction of arrival measure in terms of a unity vector $e_{DOA}(k,n)$, with $e_{DOA}(k,n)=e_1(k,n)$ and $I_a(k,n)=\|I_a(k,n)\|\cdot e_1(k,n)$, with $$I_a(k,n)=\tfrac{1}{2}Re\{P(k,n)\cdot U^*(k,n)\} \text{ and}$$

$$U(k,n)=[U_x(k,n),U_y(k,n),U_z(k,n)]^T$$

denoting the time-frequency transformed $u(t)=[u_x(t),u_y(t),u_z(t)]^T$ particle velocity vector. In other words, let p(t) and $u(t)=[u_x(t),u_y(t),u_z(t)]^T$ be the pressure and particle velocity vector, respectively, for a specific point in space, where $[\bullet]^T$ denotes the transpose. These signals can be transformed into a time-frequency domain by means of a proper filter bank e.g., a Short Time Fourier Transform (STFT) as suggested e.g. by V. Pulkki and C. Faller, Directional audio coding: Filterbank and STFT-based design, in 120th AES Convention, May 20-23, 2006, Paris, France, May 2006.

Let P(k,n) and $U(k,n)=[U_x(k,n),U_y(k,n),U_Z(k,n)]^T$ denote the transformed signals, where k and n are indices for frequency (or frequency band) and time, respectively. The active intensity vector $I_a(k,n)$ can be defined as $$I_a(k,n)=\tfrac{1}{2}Re\{P(k,n)\cdot U^*(k,n)\} \tag{1}$$

where $(\bullet)^*$ denotes complex conjugation and $Re\{\bullet\}$ extracts the real part. The active intensity vector expresses the net flow of energy characterizing the sound field, cf. F. J. Fahy, Sound Intensity, Essex: Elsevier Science Publishers Ltd., 1989, and may thus be used as a wave field measure.

Let c denote the speed of sound in the medium considered and E the sound field energy defined by F. J. Fahy $$E(k,n)=\frac{\rho_0}{4}\|U(k,n)\|^2+\frac{1}{4\rho_0 c^2}|P(k,n)|^2, \tag{2}$$

where $\|\bullet\|$ computes the 2-norm. In the following, the content of a mono DirAC stream will be detailed.

The mono DirAC stream may consist of the mono signal p(t) and of side information. This side information may comprise the time-frequency dependent direction of arrival and a time-frequency dependent measure for diffuseness. The former can be denoted with $e_{DOA}(k,n)$, which is a unit vector pointing towards the direction from which sound arrives. The latter, diffuseness, is denoted by $$\Psi(k,n).$$

In embodiments, the means 110 and/or the processor 130 can be adapted for providing/processing the first and second DOAs and/or the merged DOA in terms of a unity vector $e_{DOA}(k,n)$. The direction of arrival can be obtained as $$e_{DOA}(k,n)=-e_1(k,n),$$

where the unit vector $e_1(k,n)$ indicates the direction towards which the active intensity points, namely $$I_a(k,n)=\|I_a(k,n)\|\cdot e_1(k,n),$$

$$e_1(k,n)=I_a(k,n)/\|I_a(k,n)\|. \tag{3}$$

Alternatively in embodiments, the DOA can be expressed in terms of azimuth and elevation angles in a spherical coordinate system. For instance, if $\phi$ and $\theta$ are azimuth and elevation angles, respectively, then $$e_{DOA}(k,n)=[\cos(\phi)\cdot\cos(\theta),\ \sin(\phi)\cdot\cos(\theta),\ \sin(\theta)]^T. \tag{4}$$

In embodiments, the means 110 for determining and/or the processor 130 can be adapted for providing/processing the first and second diffuseness parameters and/or the merged diffuseness parameter by $\Psi(k,n)$ in a time-frequency dependent manner. The means 110 for determining can be adapted for providing the first and/or the second diffuseness parameters and/or the processor 130 can be adapted for providing a merged diffuseness parameter in terms of $$\Psi(k,n)=1-\frac{\|<I_a(k,n)>_t\|}{c<E(k,n)>_t}, \tag{5}$$

where $<\bullet>_t$ indicates a temporal average.

There exist different strategies to obtain P(k,n) and U(k,n) in practice. One possibility is to use a B-format microphone, which delivers 4 signals, namely w(t), x(t), y(t) and z(t). The first one, w(t), corresponds to the pressure reading of an omnidirectional microphone. The latter three are pressure readings of microphones having figure-of-eight pickup patterns directed towards the three axes of a Cartesian coordinate system. These signals are also proportional to the particle velocity. Therefore, in some embodiments $$P(k,n)=W(k,n) \tag{6}$$

$$U(k,n)=-\frac{1}{\sqrt{2}\rho_0 c}[X(k,n),Y(k,n),Z(k,n)]^T$$

where W(k,n), X(k,n), Y(k,n) and Z(k,n) are the transformed B-format signals. Note that the factor $\sqrt{2}$ in (6) comes from the convention used in the definition of B-format signals, cf. Michael Gerzon, Surround sound psychoacoustics, In *Wireless World*, volume 80, pages 483-486, December 1974.

Alternatively, P(k,n) and U(k,n) c an be estimated by means of an omnidirectional microphone array as suggested in J. Merimaa, Applications of a 3-D microphone array, in 112th *AES Convention*, Paper 5501, Munich, May 2002. The processing steps described above are also illustrated in FIG. 2.

Figure 2:
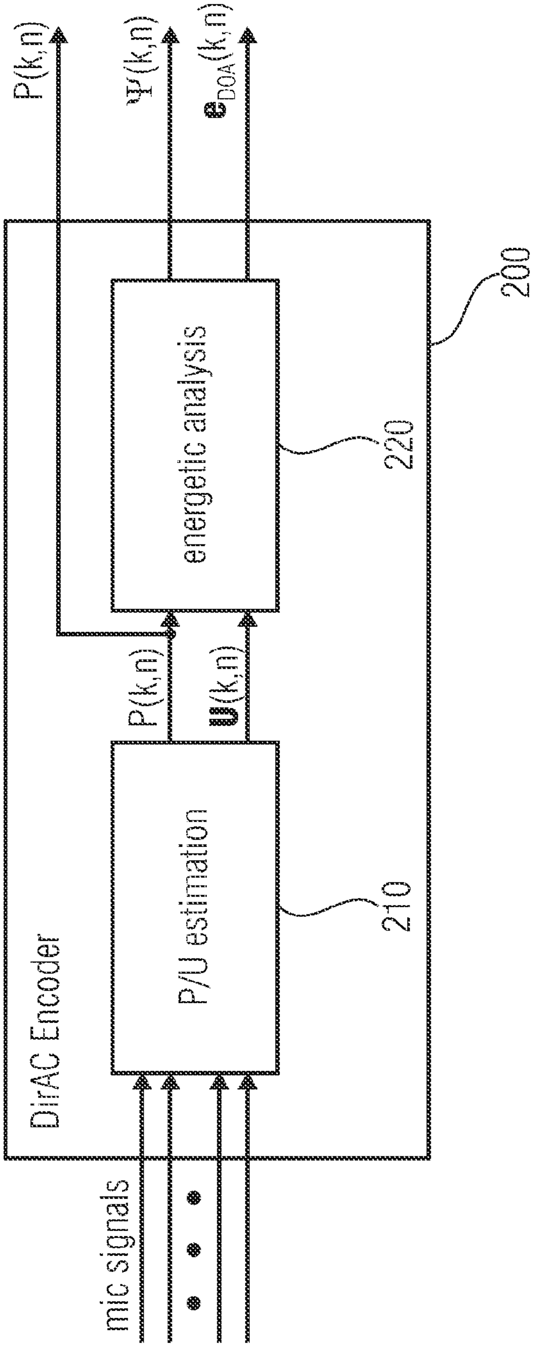
FIG. 2 is an embodiment of a DirAC encoder.

FIG. 2 shows a DirAC encoder 200, which is adapted for computing a mono audio channel and side information from proper input signals, e.g., microphone signals. In other words, FIG. 2 illustrates a DirAC encoder 200 for determining diffuseness and direction of arrival from proper microphone signals. FIG. 2 shows a DirAC encoder 200 comprising a P/U estimation unit 210. The P/U estimation unit receives the microphone signals as input information, on which the P/U estimation is based. Since all information is available, the P/U estimation is straight-forward according to the above equations. An energetic analysis stage 220 enables estimation of the direction of arrival and the diffuseness parameter of the merged stream.

In embodiments, other audio streams than mono DirAC audio streams may be merged. In other words, in embodiments the means 110 for determining can be adapted for converting any other audio stream to the first and second audio streams as for example stereo or surround audio data. In case that embodiments merge DirAC streams other than mono, they may distinguish between different cases. If the DirAC stream carried B-format signals as audio signals, then the particle velocity vectors would be known and a merging would be trivial, as will be detailed subsequently. When the DirAC stream carries audio signals other than B-format signals or a mono omnidirectional signal, the means 110 for determining may be adapted for converting to two mono DirAC streams first, and an embodiment may then merge the converted streams accordingly. In embodiments the first and the second spatial audio streams can thus represent converted mono DirAC streams.

Embodiments may combine available audio channels to approximate an omnidirectional pickup pattern. For instance, in case of a stereo DirAC stream, this may be achieved by summing the left channel L and the right channel R.

In the following, the physics in a field generated by multiple sound sources shall be illuminated. When multiple sound sources are present, it is still possible to express the pressure and particle velocity as a sum of individual components.

Let $P^{(i)}(k,n)$ and $U^{(i)}(k,n)$ be the pressure and particle velocity which would have been recorded for the i-th source, if it was to play alone. Assuming linearity of the propagation phenomenon, when N sources play together, the observed pressure P(k,n) and particle velocity U(k,n) are $$P(k,n)=\sum_{i=1}^{N}P^{(i)}(k,n) \tag{7}$$

and $$U(k,n)=\sum_{i=1}^{N}U^{(i)}(k,n). \tag{8}$$

Figure 3:
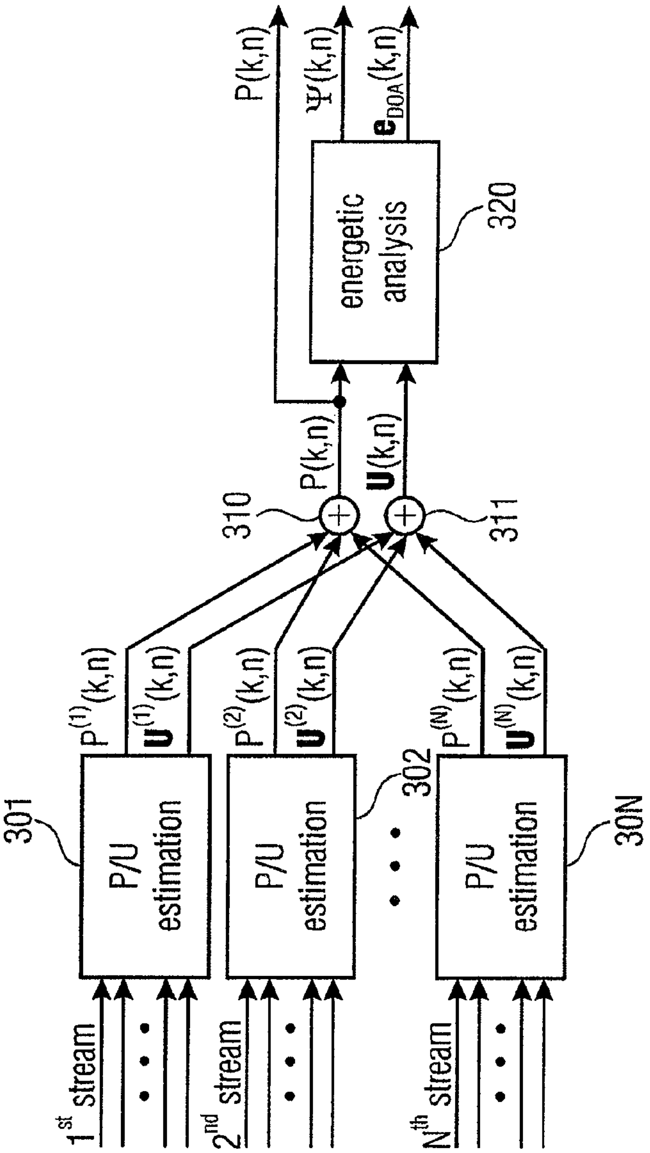
FIG. 3 is an ideal merging of audio streams.

The previous equations show that if both pressure and particle velocity were known, obtaining the merged mono DirAC stream would be straight-forward. Such a situation is depicted in FIG. 3. FIG. 3 illustrates an embodiment performing optimized or possibly ideal merging of multiple audio streams. FIG. 3 assumes that all pressure and particle velocity vectors are known. Unfortunately, such a trivial merging is not possible for mono DirAC streams, for which the particle velocity $U^{(i)}(k,n)$ is not known.

FIG. 3 illustrates N streams, for each of which a P/U estimation is carried out in blocks 301, 302-30N. The outcome of the P/U estimation blocks are the corresponding time-frequency representations of the individual $P^{(i)}(k,n)$ and $U^{(i)}(k,n)$ signals, which can then be combined according to the above equations (7) and (8), illustrated by the two adders 310 and 311. Once the combined P (k,n) and U (k,n) are obtained, an energetic analysis stage 320 can determine the diffuseness parameter Ψ(k,n) and the direction of arrival $e_{DOA}$ (k,n) in a straight-forward manner.

Figure 4:
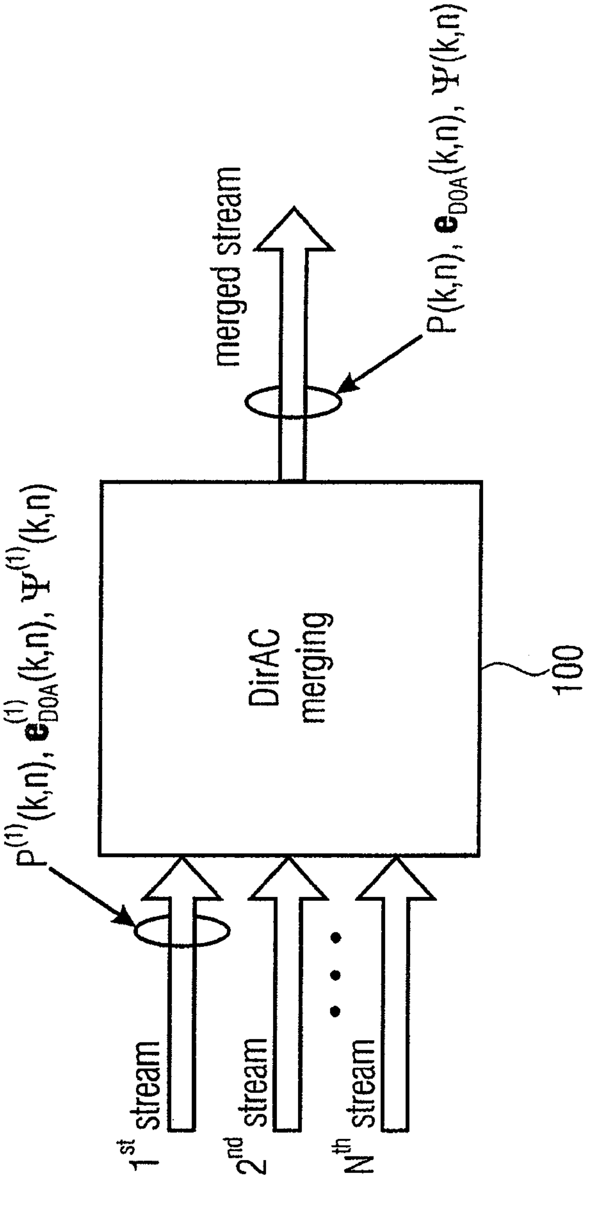
FIG. 4 is the inputs and outputs of an embodiment of a general DirAC merging processing block.

FIG. 4 illustrates an embodiment for merging multiple mono DirAC streams. According to the above description, N streams are to be merged by the embodiment of an apparatus 100 depicted in FIG. 4. As illustrated in FIG. 4, each of the N input streams may be represented by a time-frequency dependent mono representation $P^{(i)}(k,n)$, a direction of arrival $e_{DOA}^{(1)}(k,n)$ and $\Psi^{(1)}(k,n)$, where $^{(1)}$ represents the first stream. An according representation is also illustrated in FIG. 4 for the merged stream.

The task of merging two or more mono DirAC streams is depicted in FIG. 4. As the pressure P(k,n) can be obtained simply by summing the known quantities $P^{(i)}(k,n)$ as in (7), the problem of merging two or more mono DirAC streams reduces to the determination of $e_{DOA}(k,n)$ and Ψ(k,n). The following embodiment is based on the assumption that the field of each source consists of a plane wave summed to a diffuse field. Therefore, the pressure and particle velocity for the i-th source can be expressed as $$P^{(i)}(k,n)=P_{PW}^{(i)}(k,n)+P_{diff}^{(i)}(k,n) \tag{9}$$

$$U^{(i)}(k,n)=U_{PW}^{(i)}(k,n)+U_{diff}^{(i)}(k,n) \tag{10}$$

where the subscripts "PW" and "diff" denote the plane wave and the diffuse field, respectively. In the following an embodiment is presented having a strategy to estimate the direction of arrival of sound and diffuseness. The corresponding processing steps are depicted in FIG. 5.

Figure 5:
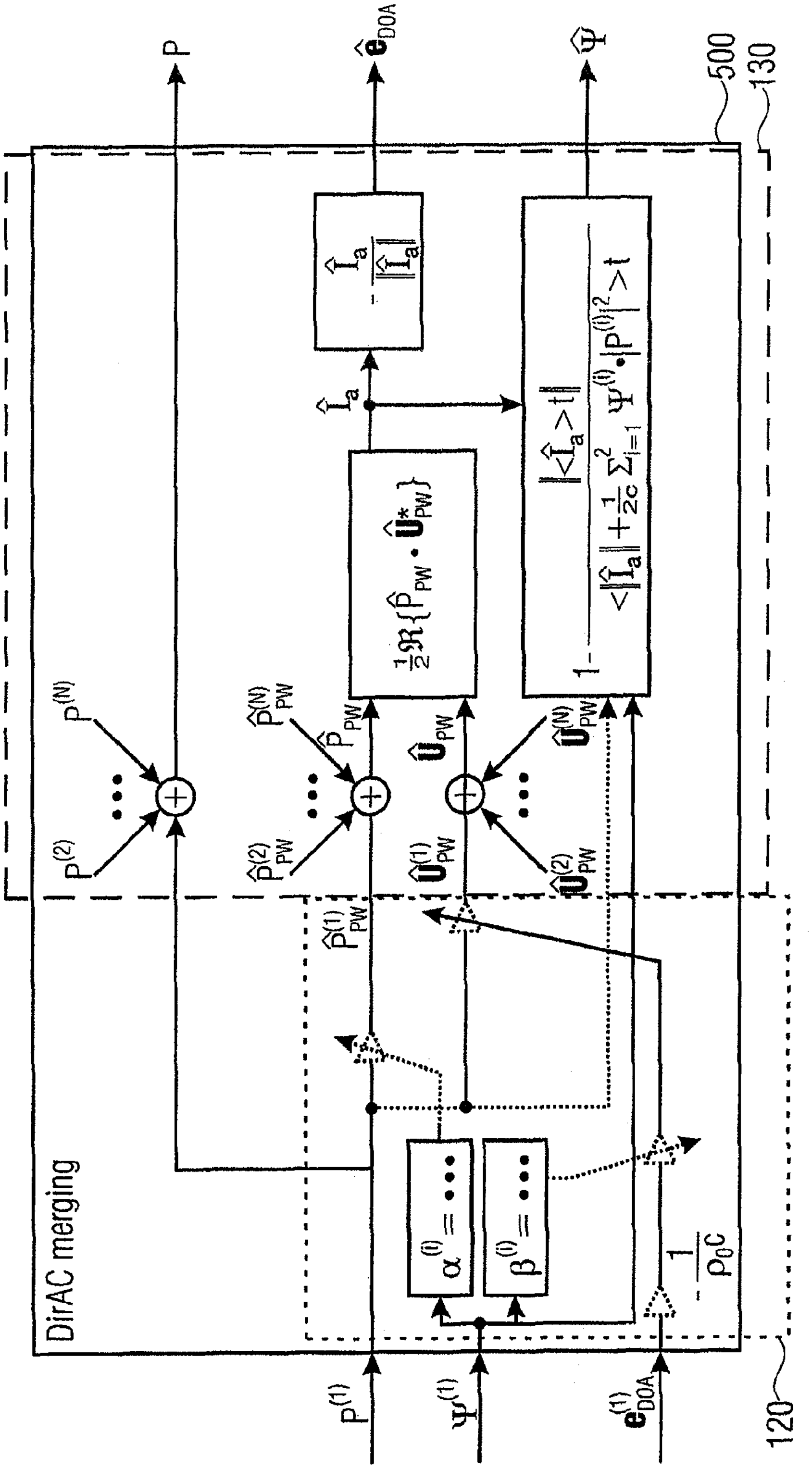
FIG. 5 is a block diagram of an embodiment.

FIG. 5 illustrates another apparatus 500 for merging multiple audio streams which will be detailed in the following. FIG. 5 exemplifies the processing of the first spatial audio stream in terms of a first mono representation $P^{(1)}$, a first direction of arrival $e_{DOA}^{(1)}$ and a first diffuseness parameter $\Psi^{(1)}$. According to FIG. 5, the first spatial audio stream is decomposed into an approximated plane wave representation $\hat{P}_{PW}^{(1)}(k,n)$ as well as the second spatial audio stream and potentially other spatial audio streams accordingly into $\hat{P}_{PW}^{(2)}(k,n) \ldots \hat{P}_{PW}^{(N)}(k,n)$. Estimates are indicated by the hat above the respective formula representation.

The estimator 120 can be adapted for estimating a plurality of N wave representations $\hat{P}_{PW}^{(i)}(k,n)$ and diffuse field representations $\hat{P}_{diff}^{(i)}(k,n)$ as approximations $\hat{P}^{(i)}(k,n)$ for a plurality of N spatial audio streams, with 1≤i≤N. The processor 130 can be adapted for determining the merged direction of arrival based on an estimate, $$\hat{e}_{DOA}(k,n)=-\frac{\hat{I}_a(k,n)}{\|\hat{I}_a(k,n)\|}, \text{ with}$$

$$\hat{I}_a(k,n)=\frac{1}{2}\mathrm{Re}\{\hat{P}_{PW}(k,n)\cdot\hat{U}_{PW}^{*}(k,n)\},$$

$$\hat{P}_{PW}(k,n)=\sum_{i=1}^{N}\hat{P}_{PW}^{(i)}(k,n),$$

$$\hat{P}_{PW}^{(i)}(k,n)=\alpha^{(i)}(k,n)\cdot P^{(i)}(k,n),$$

$$\hat{U}_{PW}(k,n)=\sum_{i=1}^{N}\hat{U}_{PW}^{(i)}(k,n),$$

$$\hat{U}_{PW}^{(i)}(k,n)=-\frac{1}{\rho_0 c}\beta^{(i)}(k,n)\cdot P^{(i)}(k,n)\cdot e_{DOA}^{(i)}(k,n),$$

with the real numbers $\alpha^{(i)}(k,n)$, $\beta^{(i)}(k,n)\in\{0 \ldots 1\}$.

FIG. 5 shows in dotted lines the estimator 120 and the processor 130. In the embodiment shown in FIG. 5, the means 110 for determining is not present, as it is assumed that the first spatial audio stream and the second spatial audio stream, as well as potentially other audio streams are provided in mono DirAC representation, i.e. the mono representations, the DOA and the diffuseness parameters are just separated from the stream. As shown in FIG. 5, the processor 130 can be adapted for determining the merged DOA based on an estimate.

The direction of arrival of sound, i.e. direction measures, can be estimated by $\hat{e}_{DOA}(k,n)$, which is computed as $$\hat{e}_{DOA}(k,n) = -\frac{\hat{I}_a(k,n)}{\|\hat{I}_a(k,n)\|}, \tag{11}$$

where $\hat{I}_a(k,n)$ is the estimate for the active intensity for the merged stream. It can be obtained as follows $$\hat{I}_a(k,n) = -\tfrac{1}{2}Re\{\hat{P}_{PW}(k,n)\cdot\hat{U}^*_{PW}(k,n)\}, \tag{12}$$

where $\hat{P}_{PW}(k,n)$ and $\hat{U}^*_{PW}(k,n)$ are the estimates of the pressure and particle velocity corresponding to the plane waves, e.g. as wave field measures, only. They can be defined as $$\hat{P}_{PW}(k,n) = \sum_{i=1}^{N} \hat{P}^{(i)}_{PW}(k,n), \tag{13}$$

$$\hat{P}^{(i)}_{PW}(k,n) = \alpha^{(i)}(k,n)\cdot P^{(i)}(k,n), \tag{14}$$

$$\hat{U}_{PW}(k,n) = \sum_{i=1}^{N} \hat{U}^{(i)}_{PW}(k,n), \tag{15}$$

$$\hat{U}^{(i)}_{PW}(k,n) = -\frac{1}{\rho_0 c}\beta^{(i)}(k,n)\cdot P^{(i)}(k,n)\cdot e^{(i)}_{DOA}(k,n). \tag{16}$$

The factors $\alpha^{(i)}(k,n)$ and $\beta^{(i)}(k,n)$ are in general frequency dependent and may exhibit an inverse proportionality to diffuseness $\Psi^{(i)}(k,n)$. In fact, when the diffuseness $\Psi^{(i)}(k,n)$ is close to 0, it can be assumed that the field is composed of a single plane wave, so that $$\hat{P}^{(i)}_{PW}(k,n) \approx P(k,n) \tag{17}$$

and $$\hat{U}^{(i)}_{PW}(k,n) \approx -\frac{1}{\rho_0 c}P^{(i)}(k,n)\cdot e^{(i)}_{DOA}(k,n), \tag{18}$$

implying that $\alpha^{(i)}(k,n)=\beta^{(i)}(k,n)=1$.

In the following, two embodiments will be presented which determine $\alpha^{(i)}(k,n)$ and $\beta^{(i)}(k,n)$. First, energetic considerations of the diffuse fields are considered. In embodiments the estimator 120 can be adapted for determining the factors $\alpha^{(i)}(k,n)$ and $\beta^{(i)}(k,n)$ based on the diffuse fields. Embodiments may assume that the field is composed of a plane wave summed to an ideal diffuse field. In embodiments the estimator 120 can be adapted for determining $\alpha^{(i)}(k,n)$ and $\beta^{(i)}(k,n)$ according to $$\alpha^{(i)}(k,n)=\beta^{(i)}(k,n)$$

$$\beta^{(i)}(k,n)=\sqrt{1-\Psi^{(i)}(k,n)}, \tag{19}$$

by setting the air density $\rho_0$ equal to 1, and dropping the functional dependency (k,n) for simplicity, it can be written $$\Psi^{(i)} = 1 - \frac{\langle|P^{(i)}_{PW}|^2\rangle_t}{\langle|P^{(i)}_{PW}|^2\rangle_t + 2c^2\langle E_{diff}\rangle_t}. \tag{20}$$

In embodiments, the processor 130 may be adapted for approximating the diffuse fields based on their statistical properties, an approximation can be obtained by $$\langle|P_{PW}^{(i)}|^2\rangle_t + 2c^2\langle E_{diff}\rangle_t \approx \langle|P^{(i)}|^2\rangle_t \tag{21}$$

where $E_{diff}$ is the energy of the diffuse field. Embodiments may thus estimate $$\langle|P_{PW}^{(i)}|\rangle_t \approx \langle|\hat{P}_{PW}^{(i)}|\rangle_t\sqrt{1-\Psi^{(i)}}\langle|P^{(i)}|\rangle_t. \tag{22}$$

To compute instantaneous estimates (i.e., for each time-frequency tile), embodiments may remove the expectation operators, obtaining $$\hat{P}_{PW}^{(i)}(k,n)=\sqrt{1-\Psi^{(i)}(k,n)}P^{(i)}(k,n). \tag{23}$$

By exploiting the plane wave assumption, the estimate for the particle velocity can be derived directly $$\hat{U}^{(i)}_{PW}(k,n) = \frac{1}{c\rho_0}\hat{P}^{(i)}_{PW}(k,n)\cdot e^{(i)}_I(k,n). \tag{24}$$

In embodiments a simplified modeling of the particle velocity may be applied. In embodiments the estimator 120 may be adapted for approximating the factors $\alpha^{(i)}(k,n)$ and $\beta^{(i)}(k,n)$ based on the simplified modeling. Embodiments may utilize an alternative solution, which can be derived by introducing a simplified modeling of the particle velocity $$\alpha^{(i)}(k,n) = 1 \tag{25}$$

$$\beta^{(i)}(k,n) = \frac{1-\sqrt{1-(1-\Psi^{(i)}(k,n))^2}}{1-\Psi^{(i)}(k,n)}.$$

A derivation is given in the following. The particle velocity $U^{(i)}(k,n)$ is modeled as $$U^{(i)}(k,n) = \beta^{(i)}(k,n)\cdot\frac{P^{(i)}}{\rho_0 c}\cdot e^{(i)}_I(k,n). \tag{26}$$

The factor $\beta^{(i)}(k,n)$ can be obtained by substituting (26) into (5), leading to $$\Psi^{(i)}(k,n) = 1 - \frac{\frac{1}{\rho_0 c}\left\|\left\langle|\beta^{(i)}(k,n)\cdot P^{(i)}(k,n)|^2\cdot e^{(i)}_I(k,n)\right\rangle_t\right\|}{c\left\langle\frac{1}{2\rho_0 c^2}|P^{(i)}(k,n)|^2\cdot(\beta^{(i)2}(k,n)+1)\right\rangle_t}. \tag{27}$$

To obtain instantaneous values the expectation operators can be removed and solved for $\beta^{(i)}(k,n)$, obtaining $$\beta^{(i)}(k,n) = \frac{1-\sqrt{1-(1-\Psi^{(i)}(k,n))^2}}{1-\Psi^{(i)}(k,n)}. \tag{28}$$

Note that this approach leads to similar directions of arrival of sound as the one given in (19), however, with a lower computational complexity given that the factor $\alpha^{(i)}(k,n)$ is unity.

In embodiments, the processor 130 may be adapted for estimating the diffuseness, i.e., for estimating the merged diffuseness parameter. The diffuseness of the merged stream, denoted by $\Psi(k,n)$, can be estimated directly from the known quantities $\Psi^{(i)}(k,n)$ and $P^{(i)}(k,n)$ and from the estimate $\hat{I}_a(k,n)$, obtained as described above. Following the energetic considerations introduced in the previous section, embodiments may use the estimator $$\hat{\Psi}(k,n) = 1 - \frac{\left\|\left\langle \hat{I}_a(k,n)\right\rangle_t\right\|}{\left\langle \left\|\hat{I}_a(k,n)\right\| + \frac{1}{2c}\sum_{i=1}^{2} \Psi^{(i)}(k,n)\cdot\left|P^{(i)}(k,n)\right|^2\right\rangle_t}. \quad (29)$$

The knowledge of fig, and $\hat{P}_{PW}^{(i)}$ and $\hat{U}_{PW}^{(i)}$, allows usage of the alternative representations given in equation (b) in embodiments. In fact, the direction of the wave can be obtained by $\hat{U}_{PW}^{(i)}$ whereas $\hat{P}_{PW}^{(i)}$ gives the amplitude and phase of the i-th wave. From the latter, all phase differences $\Delta^{(i,j)}$ can be readily computed. The DirAC parameters of the merged stream can be then computed by substituting equation (b) into equation (a), (3), and (5).

Figure 6:
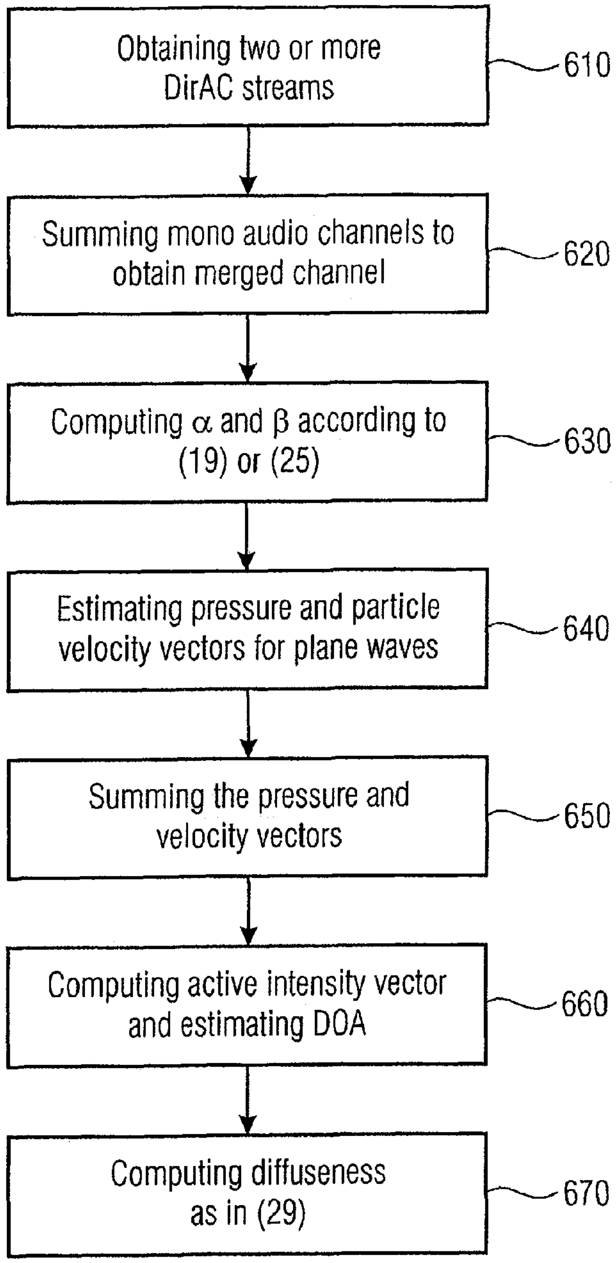
FIG. 6 is a flowchart of an embodiment of a method for merging.

FIG. 6 illustrates an embodiment of a method for merging two or more DirAC streams. Embodiments may provide a method for merging a first spatial audio stream with a second spatial audio stream to obtain a merged audio stream. In embodiments, the method may comprise a step of determining for the first spatial audio stream a first audio representation and a first DOA, as well as for the second spatial audio stream a second audio representation and a second DOA. In embodiments, DirAC representations of the spatial audio streams may be available, the step of determining then simply reads the according representations from the audio streams. In FIG. 6, it is supposed that the two or more DirAC streams can be simply obtained from the audio streams according to step 610.

In embodiments, the method may comprise a step of estimating a first wave representation comprising a first wave direction measure and a first wave field measure for the first spatial audio stream based on the first audio representation, the first DOA and optionally a first diffuseness parameter. Accordingly, the method may comprise a step of estimating a second wave representation comprising a second wave direction measure and a second wave field measure for the second spatial audio stream based on the second audio representation, the second DOA and optionally a second diffuseness parameter.

The method may further comprise a step of combining the first wave representation and the second wave representation to obtain a merged wave representation comprising a merged field measure and a merged DOA measure and a step of combining the first audio representation and the second audio representation to obtain a merged audio representation, which is indicated in FIG. 6 by step 620 for mono audio channels. The embodiment depicted in FIG. 6 comprises a step of computing $\alpha^{(i)}(k,n)$ and $\beta^{(i)}(k,n)$ according to (19) and (25) enabling the estimation of the pressure and particle velocity vectors for the plane wave representations in step 640. In other words, the steps of estimating the first and second plane wave representations is carried out in steps 630 and 640 in FIG. 6 in terms of plane wave representations.

The step of combining the first and second plane wave representations is carried out in step 650, where the pressure and particle velocity vectors of all streams can be summed.

In step 660 of FIG. 6, computing of the active intensity vector and estimating the DOA is carried out based on the merged plane wave representation.

Embodiments may comprise a step of combining or processing the merged field measure, the first and second mono representations and the first and second diffuseness parameters to obtain a merged diffuseness parameter. In the embodiment depicted in FIG. 6, the computing of the diffuseness is carried out in step 670, for example, on the basis of (29).

Embodiments may provide the advantage that merging of spatial audio streams can be performed with high quality and moderate complexity.

Depending on certain implementation requirements of the inventive methods, the inventive methods can be implemented in hardware or software. The implementation can be performed using a digital storage medium, and particularly a flash memory, a disk, a DVD or a CD having electronically readable control signals stored thereon, which cooperate with a programmable computer system such that the inventive methods are performed. Generally, the present invention is, therefore, a computer program code with a program code stored on a machine-readable carrier, the program code being operative for performing the inventive methods when the computer program runs on a computer or processor. In other words, the inventive methods are, therefore, a computer program having a program code for performing at least one of the inventive methods, when the computer program runs on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus for merging a first spatial audio stream comprising a first audio representation having a measure for a pressure or a magnitude of a first audio signal and a first direction of arrival with a second spatial audio stream comprising a second audio representation having a measure for a pressure or a magnitude of a second audio signal and a second direction of arrival to acquire a merged audio stream, the apparatus for merging comprising an estimator for estimating a first wave representation, the first wave representation comprising a first wave direction measure being a directional quantity of a first wave and a first wave field measure being related to a magnitude of the first wave for the first spatial audio stream, and for estimating a second wave representation comprising a second wave direction measure being a directional quantity of a second wave and a second wave field measure being related to a magnitude of the second wave for the second spatial audio stream; and a processor for processing the first wave representation and the second wave representation to acquire a merged wave representation, the merged wave representation comprising a merged wave field measure, a merged direction of arrival measure and a merged diffuseness parameter, wherein the merged diffuseness parameter is based on the merged wave field measure, the first audio representation and the second audio representation, and wherein the merged wave field measure is based on the first wave field measure, the second wave field measure, the first wave direction measure, and the second wave direction measure, and wherein the processor is configured for processing the first audio representation and the second audio representation to acquire a merged audio representation, and for providing the merged audio stream comprising the merged audio representation, the merged direction of arrival measure and the merged diffuseness parameter.

2. The apparatus of claim 1, wherein the estimator is adapted for estimating the first wave field measure in terms of a first wave field amplitude and for estimating the second wave field measure in terms of a second wave field amplitude, and for estimating a phase difference between the first wave field measure and the second wave field measure, and/or for estimating a first wave field phase and a second wave field phase.

3. The apparatus of claim 1, comprising a determiner for determining for the first spatial audio stream the first audio representation, the first direction of arrival measure and the first diffuseness parameter, and for determining for the second spatial audio stream the second audio representation, the second direction of arrival measure and the second diffuseness parameter.

4. The apparatus of claim 1, wherein the processor is adapted for determining the merged audio representation, the merged direction of arrival measure and the merged diffuseness parameter in a time-frequency dependent way.

5. The apparatus of claim 1, wherein the estimator is adapted for estimating the first and/or second wave representations, and wherein the processor is adapted for providing the merged audio representation in terms of a pressure signal p(t) or a time-frequency transformed pressure signal P(k,n), wherein k denotes a frequency index and n denotes a time index.

6. The apparatus of claim 5, wherein the processor is adapted for processing the first and second directions of arrival measures and/or for providing the merged direction of arrival measure in terms of a unity vector $e_{DOA}$(k,n), with $$e_{DoA}(k,n)=-e_I(k,n) \text{ and}$$

$$I_a(k,n)=\|I_a(k,n)\|\cdot e_I(k,n),$$

with $$I_a(k,n)=1/2Re\{P(k,n)\cdot U^*(k,n)\}$$

where P(k,n) is the pressure of merged stream and U(k, n)=[$U_x$(k, n), $U_y$(k, n), $U_z$(k, n)]$^T$ denotes the time-frequency transformed u(t)=[$u_x$(t), $u_y$(t), $u_z$(t)]$^T$ particle velocity vector of the merged audio stream, where Re{•} denotes the real part.

7. The apparatus of one of the claim 6, wherein the processor is adapted for processing the first and/or the second diffuseness parameters and/or for providing the merged diffuseness parameter in terms of $$\Psi(k,n) = 1 - \frac{\|\langle I_a(k,n)\rangle_t\|}{c\langle E(k,n)\rangle_t},$$

$$I_a(k,n) = \frac{1}{2}\mathrm{Re}\{P(k,n)\cdot U^*(k,n)\}$$

and U(k, n)=[U(k, n),$U_y$(k, n),$U_z$(k, n)]$^T$ denoting a time-frequency transformed u(t)=[$u_x$(t),$u_y$(t),$u_z$(t)]$^T$ particle velocity vector, Re{•} denotes the real part, P(k, n) denoting a time-frequency transformed pressure signal p(t), wherein k denotes a frequency index and n denotes a time index, c is the speed of sound and $$E(k,n) = \frac{\rho_0}{4}\|U(k,n)\|^2 + \frac{1}{4\rho_0 c^2}|P(k,n)|^2$$

denotes the sound field energy, where $\rho_0$ denotes the air density and $<\bullet>_t$ denotes a temporal average.

8. The apparatus of claim 7, wherein the estimator is adapted for estimating a plurality of N wave representations $\hat{P}_{PW}^{(i)}$(k, n) and diffuse field representations $\hat{P}_{diff}^{(i)}$(k, n) as approximations for a plurality of N spatial audio streams $\hat{P}^{(i)}$(k, n), with 1≤i≤N, and wherein the processor is adapted for determining the merged direction of arrival measure based on an estimate, $$\hat{e}_{DOA}(k,n) = -\frac{\hat{I}_a(k,n)}{\|\hat{I}_a(k,n)\|},$$

$$\hat{I}_a(k,n) = \frac{1}{2}\mathrm{Re}\{\hat{P}_{PW}(k,n)\cdot\hat{U}^*_{PW}(k,n)\},$$

$$\hat{P}_{PW}(k,n) = \sum_{i=1}^{N}\hat{P}^{(i)}_{PW}(k,n),$$

$$\hat{P}^{(i)}_{PW}(k,n) = \alpha^{(i)}(k,n)\cdot P^{(i)}(k,n),$$

$$\hat{U}_{PW}(k,n) = \sum_{i=1}^{N}\hat{U}^{(i)}_{PW}(k,n),$$

$$\hat{U}^{(i)}_{PW}(k,n) = -\frac{1}{\rho_0 c}\beta^{(i)}(k,n)\cdot P^{(i)}(k,n)\cdot e^{(i)}_{DOA}(k,n),$$

with the real numbers $\alpha^{(i)}$(k, n),$\beta^{(i)}$(k, n)∈{0 . . . 1} and U(k, n)=[$U_x$(k, n),$U_y$(k, n),$U_z$(k, n)]$^T$ denoting a time-frequency transformed u(t)=[$u_x$(t),$u_y$(t),$u_z$(t)]$^T$ particle velocity vector, Re{•} denotes the real part, $P^{(i)}$(k, n) denoting a time-frequency transformed pressure signal $p^{(i)}$(t), wherein k denotes a frequency index and n denotes a time index, N the number of spatial audio streams, c is the speed of sound and $\rho_0$ denotes the air density.

9. The apparatus of claim 8, wherein the estimator is adapted for determining $\alpha^{(i)}$(k, n) and $\beta^{(i)}$(k, n) according to $$\alpha^{(i)}(k,n)=\beta^{(i)}(k,n)$$

$$\beta^{(i)}(k,n)=\sqrt{1-\Psi^{(i)}(k,n)}.$$

10. The apparatus of claim 8, wherein the processor is adapted for determining $\alpha^{(i)}$(k, n) and $\beta^{(i)}$(k, n) by $$\alpha^{(i)}(k,n) = 1$$

$$\beta^{(i)}(k,n) = \frac{1-\sqrt{1-(1-\Psi^{(i)}(k,n))^2}}{1-\Psi^{(i)}(k,n)}.$$

11. The apparatus of claim 9, wherein the processor is adapted for determining the merged diffuseness parameter by $$\hat{\Psi}(k, n) = 1 - \frac{\left\| \left\langle \hat{I}_a(k, n) \right\rangle_t \right\|}{\left\langle \left\| \hat{I}_a(k, n) \right\| + \frac{1}{2c} \sum_{i=1}^{2} \Psi^{(i)}(k, n) \cdot |P^{(i)}(k, n)|^2 \right\rangle_t}.$$

12. An apparatus of claim 1, wherein the first spatial audio stream additionally comprises a first diffuseness parameter, wherein the second spatial audio stream additionally comprises a second diffuseness parameter, and wherein the processor is configured to calculated the merged diffuseness parameter additionally based on the first diffuseness parameter and the second diffuseness parameter.

13. A method for merging a first spatial audio stream with a second spatial audio stream to acquire a merged audio stream, comprising:

estimating a first wave representation comprising a first wave direction measure being a directional quantity of a first wave and a first wave field measure being related to a magnitude of the first wave for the first spatial audio stream, the first spatial audio stream comprising a first audio representation comprising a measure for a pressure or a magnitude of a first audio signal and a first direction of arrival;

estimating a second wave representation comprising a second wave direction measure being a directional quantity of a second wave and a second wave field measure being related to a magnitude of the second wave for the second spatial audio stream, the second spatial audio stream comprising a second audio representation comprising a measure for a pressure or a magnitude of a second audio signal and a second direction of arrival;

processing the first wave representation and the second wave representation to acquire a merged wave representation comprising a merged wave field measure, a merged direction of arrival measure and a merged diffuseness parameter, wherein the merged diffuseness parameter is based on the merged wave field measure, the first audio representation and the second audio representation, and wherein the merged wave field measure is based on the first wave filed measure, the second wave field measure, the first wave direction measure, and the second wave direction measure;

processing the first audio representation and the second audio representation to acquire a merged audio representation; and providing the merged audio stream comprising the merged audio representation, a merged direction of arrival measure and the merged diffuseness parameter.

14. A method of claim 13, wherein the first spatial audio stream additionally comprises a first diffuseness parameter, wherein the second spatial audio stream additionally comprises a second diffuseness parameter, and wherein the merged diffuseness parameter is calculated in the step of processing additionally based on the first diffuseness parameter and the second diffuseness parameter.

15. Non-transitory storage medium having stored thereon a computer program comprising a program code for performing the method, when the program code runs on a computer or a processor, for merging a first spatial audio stream with a second spatial audio stream to acquire a merged audio stream, the method comprising:

estimating a first wave representation comprising a first wave direction measure being a directional quantity of a first wave and a first wave field measure being related to a magnitude of the first wave for the first spatial audio stream, the first spatial audio stream comprising a first audio representation comprising a measure for a pressure or a magnitude of a first audio signal and a first direction of arrival;

estimating a second wave representation comprising a second wave direction measure being a directional quantity of a second wave and a second wave field measure being related to a magnitude of the second wave for the second spatial audio stream, the second spatial audio stream comprising a second audio representation comprising a measure for a pressure or a magnitude of a second audio signal and a second direction of arrival;

processing the first wave representation and the second wave representation to acquire a merged wave representation comprising a merged wave field measure, a merged direction of arrival measure and a merged diffuseness parameter, wherein the merged diffuseness parameter is based on the merged wave field measure, the first audio representation and the second audio representation, and wherein the merged wave field measure is based on the first wave filed measure, the second wave field measure, the first wave direction measure, and the second wave direction measure;

processing the first audio representation and the second audio representation to acquire a merged audio representation; and providing the merged audio stream comprising the merged audio representation, a merged direction of arrival measure and the merged diffuseness parameter.

* * * * *